United States Patent [19]

Katayama

[11] Patent Number: 5,229,641
[45] Date of Patent: Jul. 20, 1993

[54] SEMICONDUCTOR CARD AND MANUFACTURING METHOD THEREFOR

[75] Inventor: Yosuke Katayama, Toride, Japan

[73] Assignee: Hitachi Maxell, Ltd., Osaka, Japan

[21] Appl. No.: 935,461

[22] Filed: Aug. 26, 1992

Related U.S. Application Data

[63] Continuation of Ser. No. 616,927, Nov. 21, 1990, abandoned.

[30] Foreign Application Priority Data

Nov. 25, 1989 [JP] Japan .................................. 1-305102

[51] Int. Cl.⁵ .......................... G04C 3/00; H01M 2/10; H05K 7/00
[52] U.S. Cl. .................... 257/678; 257/729; 257/702; 361/392; 235/492
[58] Field of Search ............... 357/72, 74; 361/392, 361/394; 235/492; 257/729, 702

[56] References Cited

U.S. PATENT DOCUMENTS

| | | | |
|---|---|---|---|
| 4,086,752 | 5/1978 | Kishimoto | 357/72 |
| 4,143,508 | 3/1979 | Ohno | 357/72 |
| 4,511,796 | 4/1985 | Aigo | 235/492 |
| 4,730,236 | 3/1988 | Heinemeyer et al. | 361/392 |
| 4,755,661 | 7/1988 | Ruebsam | 235/492 |
| 4,842,966 | 6/1989 | Omori et al. | 361/392 |
| 4,943,708 | 7/1990 | Simmons et al. | 235/492 |

FOREIGN PATENT DOCUMENTS 61-222712 10/1986 Japan .

*Primary Examiner*—Eugene R. LaRoche
*Assistant Examiner*—Viet Q. Nguyen
*Attorney, Agent, or Firm*—Birch, Stewart, Kolasch & Birch

[57] ABSTRACT

A semiconductor card which at least comprises a printed circuit board, a volatile memory element mounted on the printed circuit board, a battery electrically connected with the printed board for serving to back up the volatile memory element, an input/output interface portion mounted on the printed board for communication with an external device, and a sealant or sealing layer made of a thermosetting resin in which the printed circuit board, volatile memory element and interface portion are integrally embedded, the semiconductor card further including a battery receiving portion formed of a thermoplastic resin having a space for receiving the battery therein, and a battery cover formed of a thermoplastic resin so as to serve to close an opening in the battery receiving portion, the battery receiving portion being fixed to the printed circuit board and integrally embedded in the sealing layer together with the other stated elements on the printed circuit board, and the battery receiving portion is joined after receiving the battery therein with a battery cover by means of welding.

8 Claims, 3 Drawing Sheets

SEMICONDUCTOR CARD AND MANUFACTURING METHOD THEREFOR

This application is a continuation of application Ser. No. 07/616,927 filed on Nov. 21, 1990, now abandoned.

BACKGROUND OF THE INVENTION

1. Field of the Invention

The present invention relates to a semiconductor card called an IC card, for example, and more particularly, to a semiconductor card (which will hereinafter be the referred to as an "information card") having a volatile memory element and a back up battery and a manufacturing method thereof.

2. Discussion of Related Art

In recent years, in the field of semiconductor cards, it has been the procedure to substitute volatile memory for nonvolatile memory for the purpose of speeding up signal processing as well as for the reduction of cost. Use of the volatile memory element naturally requires a backup battery to be built in the card.

An example of this kind of semiconductor card is shown in FIGS. 9 and 10. FIG. 9 is a sectional view of a semiconductor card in a state before being molded with resin, and FIG. 10 is a sectional view of the semiconductor card in a state after being molded with the resin.

As shown in FIG. 9, a thin casing 51 comprising an upper casing 51a and a lower casing 51b is formed of a synthetic resin. Separately from the casing 51, a printed circuit board 54, on which various electronic components 52 each having the function of volatile memory, control section, interface portion or the like, and a backup battery 53 are mounted, is encased by the lower casing 51b.

The upper casing 51a is put on the lower casing 51b so as to define a space 55 therebetween. A law molecular weight liquid epoxy resin is poured into the space 55 and hardened to form a sealing layer 56 (see FIG. 10).

With this contemplated procedure and structure, however, it takes a long time to harden the epoxy resin and the epoxy resin must be subjected to defoaming after being poured into the casing 51, resulting in very poor productivity and hence an increased cost. Moreover, since the epoxy resin has a high coefficient of contraction or shrinkage due to the hardening thereof, a shrinkage cavity is generated within the sealing layer 56 to form a gap between the casing 51 and the sealing layer 56, resulting in a deformation (depression) of the card.

In order to eliminate the above problems, a method for manufacturing an information card or semiconductor card has been developed in which a sealing layer of a thermosetting resin having a high molecular weight is formed by an injection molding process in such a manner that a printed circuit board having various electronic components mounted thereon is embedded therein. In this case, instead of subjecting the backup battery to the injection molding together with the printed circuit board, a recess for receiving the battery is formed at a predetermined position in the sealing layer so that, after the formation of the sealing layer, the battery is introduced into the recess and an opening of the recess is closed by a battery cover.

The reason why the battery is not subjected to the injection molding at the time of forming the sealing layer as described above is to prevent the battery from being thermally effected.

Further, the reason why a thermosetting resin is used to form the sealing layer is that the thermosetting resin is more excellent in general than a thermoplastic resin in terms of water resistance and mechanical strength.

However, since the sealing layer having the recess is formed of the thermosetting resin as mentioned above, it is impossible to provide a sufficient welding strength between the sealing layer and the battery cover also formed of a thermosetting resin. In particular, considering mass productivity, an ultrasonic welding is suitable by which the welding operation can be completed in a short time. However, since both the sealing layer and the battery cover are formed of a thermosetting resin as described above, ultrasonic welding is also not applicable.

The information card or semiconductor card, which is portable judging from its shape and size is required to have a high water resisting property since there are possibilities of the card being suddenly splashed with water, such as by being dropped into water, or being washed or getting wet in the rain.

SUMMARY OF THE INVENTION

Therefore, an object of the present invention is to provide an information card, i.e. semiconductor card, and method of manufacture which eliminates the problems stated above which is excellent in productivity and which information card has a high water resisting property.

To this end, there is provided according to the present invention a semiconductor or information card which comprises a printed circuit board, a volatile memory element mounted on the printed circuit board, a battery electrically connected with the printed circuit board for serving as a back up the volatile memory element, an interface portion mounted on the printed circuit board so as to be used for communication with or input/output from/to an external device, and a sealing layer made of a thermosetting resin in which the printed circuit board, volatile memory element and interface portion are embedded integrally therein wherein the semiconductor card further comprises a battery receiving portion formed of a thermoplastic resin so as to provide a space for receiving the battery therein, and a battery cover formed of a thermoplastic resin so as to serve to close the opening in the space of the battery receiving portion, the battery receiving portion being fixed to the printed circuit board while being connected integrally with the sealing layer, the battery receiving portion being joined after receiving the battery therein with the battery cover by welding, such as ultrasonic welding.

There is further provided according to the present invention a method for manufacturing the above described semiconductor card which includes a printed circuit board, a volatile memory element mounted on the printed circuit board, a battery electrically connected with the printed circuit board for serving to back up the volatile memory element, an interface portion mounted on the printed circuit board so as to be used for communication with or input/output from/to an external device, and a sealing layer made of a thermosetting resin in which the printed circuit board, volatile memory element and interface portion are embedded integrally therewith, the method comprising the steps of mounting on the printed circuit board essential elements including the volatile memory element, an interface portion and the like, forming a battery receiving portion which serves to receive the battery therein with the use of a thermoplastic resin, fixing the battery receiving portion to a predetermined position on the printed circuit board through an adhesive layer, and then embedding or encasing the printed circuit board and the battery receiving portion in the sealing layer by an injection molding process. The battery receiving portion is finally joined with a battery receiving cover.

According to the semiconductor card of the present invention, since both the battery receiving portion and the battery cover are formed of a thermoplastic resin, the battery receiving portion and the battery cover can be easily and reliably joined together by a welding, such as by ultrasonic welding for example. In consequence, it is possible to provide an information card or semiconductor card having a highly water-proof structure.

Further, according to the semiconductor card production method of the present invention, since both the battery receiving portion separately formed beforehand of a thermoplastic resin and the printed circuit board are embedded in the sealing layer by the injection molding process, it is possible to manufacture the information card or semiconductor card without substantially thermally affecting the printed board and particularly the back-up battery.

It may be considered possible as an information card (semiconductor card) manufacturing method for the sealing layer to be formed by the injection molding process with the printed board and elements mounted thereon embedded therein except for the portion corresponding to the battery receiving portion and then the battery receiving portion is formed by being molded integrally with the sealing layer.

However, the temperature of the thermoplastic resin during molding (about 270° C.) is generally higher than the temperature of the thermosetting resin during molding (about 150° C.), so that in a case of forming the battery receiving portion continuously to and integrally with the sealing layer with use of a thermoplastic resin, after the sealing of the printed circuit board, heat due to molding will affect the printed circuit board as well. The printed circuit board is formed with lands of solder and the like so that there are problems that the heat will act to melt the solder to cause an imperfect electrical connection or the heat will act on the various semiconductor elements on the printed circuit board so that they deteriorate or lose their function.

For this reason, according to the present invention, the battery receiving portion is formed of a thermoplastic resin at a higher required molding temperature separately from the printed circuit board, and the battery receiving portion and the printed circuit board are embedded in the sealing layer of the thermosetting resin at a relatively low molding temperature by the injection molding process. Therefore, it is possible to manufacture the information card or semiconductor card without substantially thermally affecting the printed circuit board.

The foregoing and other objects, features and advantages of the invention will be made clearer by the description of the following preferred embodiment referring to drawings hereinafter.

DETAILED DESCRIPTION OF THE INVENTION

The description will now be given of a preferred embodiment of the present invention with reference to the accompanying drawings.

Figure 1:
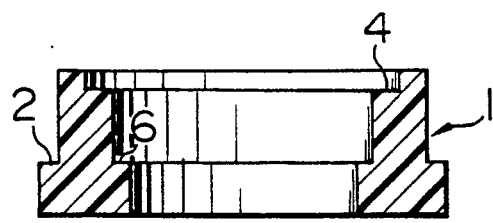
FIG. 1 is a sectional view of a battery receiving portion according to the present invention.
Figure 2:
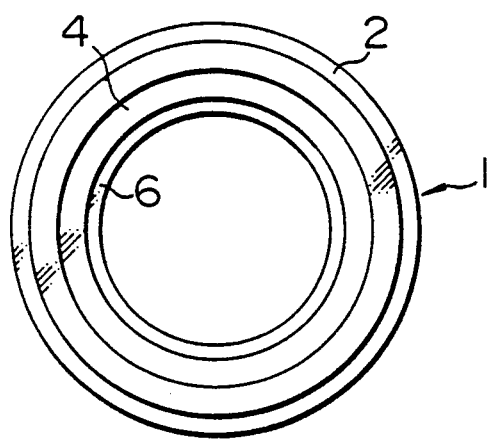
FIG. 2 is a plan view of the battery receiving portion shown in FIG. 1.
Figure 5:
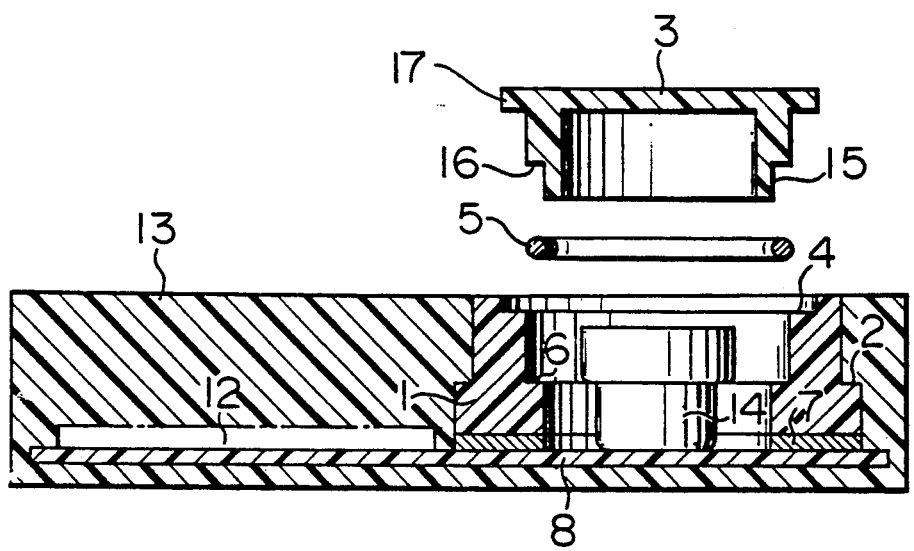
FIG. 5 is a sectional view showing a state before a battery cover is mounted.
Figure 8:
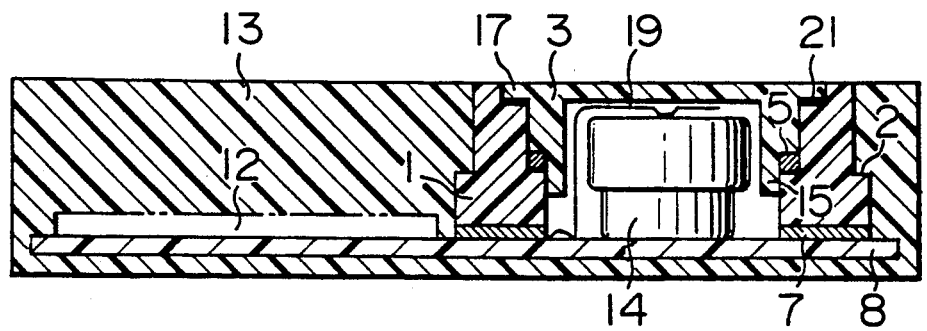
FIG. 8 is a sectional view of a sealed information card or semiconductor card.
Figure 9:
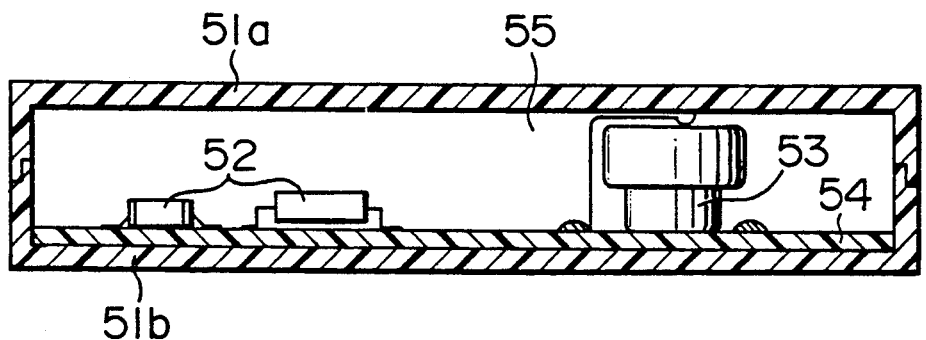
FIG. 9 is a sectional view of a conventional semiconductor card in a state before being poured with a resin.
Figure 10:
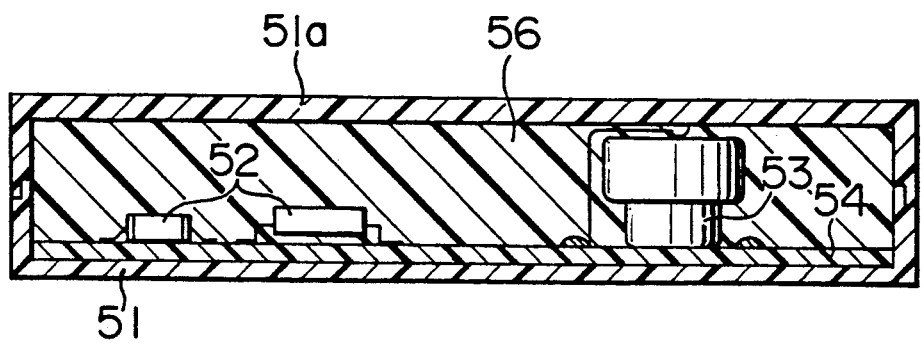
FIG. 10 is a sectional view of a conventional semiconductor card in a state after being poured with the resin.

As shown in FIGS. 1 and 2, a battery receiving portion 1, which is made of a thermoplastic resin such as a styrene resin, an acetal resin or a polyamide resin, is formed into a cylindrical shape having an annular separation preventive stepped portion 2 formed at an intermediate position on its outer periphery. At an inner circumferential surface adjacent to an upper end opening of the battery receiving portion 1, a welding stepped portion 4 is formed to which a battery cover 3, to be described later with reference to FIGS. 5 and 8, is to be welded. In addition, below the welding stepped portion 4, on the inner surface of the battery receiving portion 1, a ring-retaining stepped portion 6 is formed on which an O ring 5, to be described later with reference to FIGS. 5 and 8, is to be placed.

Figure 3:
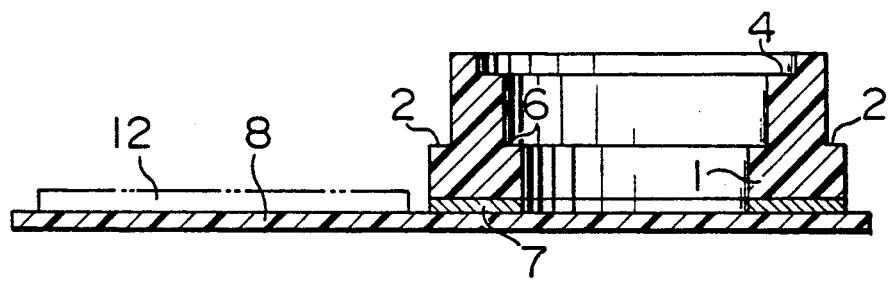
FIG. 3 is a sectional view showing a state in which the battery receiving portion is fixed to a printed circuit board.
Figure 7:
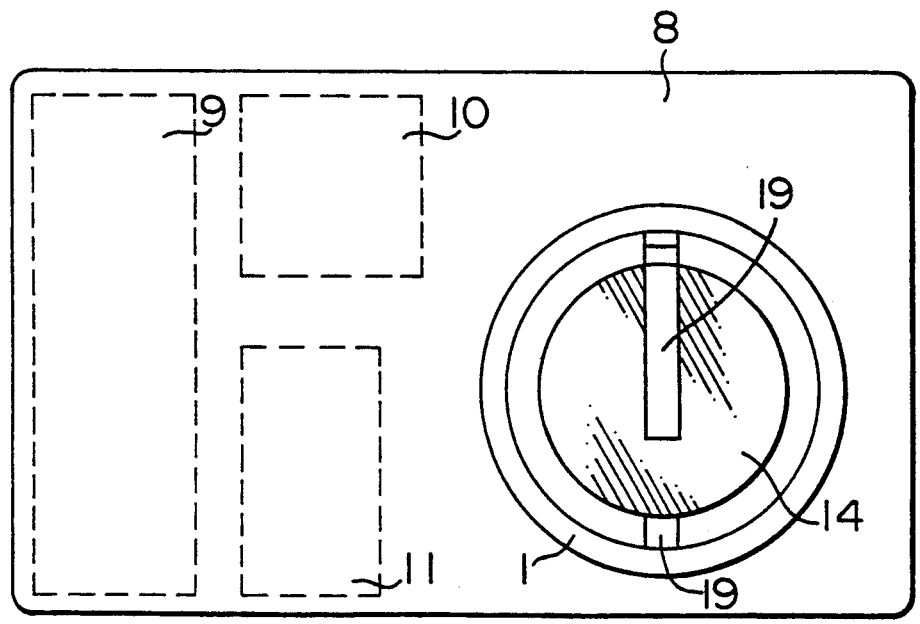
FIG. 7 is a plan view of FIG. 4 showing the state in which the battery cover is not attached.

The battery receiving portion 1 is fixed at a predetermined position on a printed circuit board 8 through an adhesive layer 7, such as an epoxy resin, for example, as shown in FIG. 3. A substrate or board of the printed circuit board 8 is made of a thermosetting resin, such as epoxy resin. On this printed circuit board 8, various electronic components 12, such as an input/output interface portion 9, serving for data transfer from/to an external device (not shown), a data processing portion 10 and a volatile memory element 11 are mounted in their respective predetermined or designed positions, as shown in FIG. 7.

Figure 4:
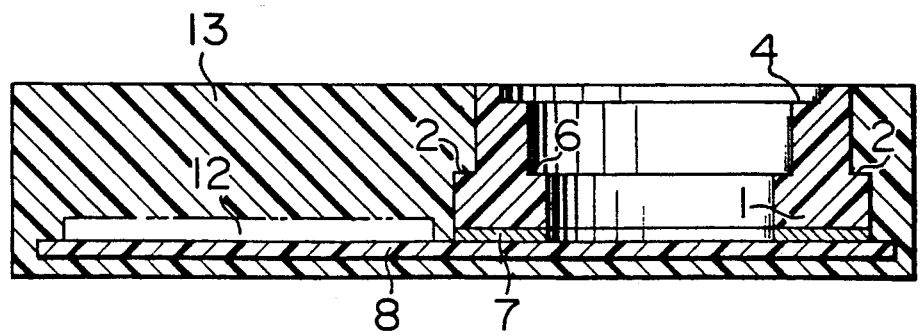
FIG. 4 is a sectional view showing a state in which the battery receiving portion and the printed circuit board shown in FIG. 3 are embedded in a sealing layer by an injection molding process.

The battery receiving portion 1 and the printed circuit board 8 thus combined in one body are set within a metal mold so as to be subjected to injection molding to be embedded in a sealing layer 13 made of a thermosetting resin, such as a polyester resin, an epoxy resin or the like. As shown in FIGS. 4 and 5, the outer periphery of the battery receiving portion 1 is surrounded by the sealing layer or sealant 13 so that the separation preventive stepped portion 2 of the battery receiving portion 1 is brought into engagement with the sealant 13, insuring that the battery receiving portion 1 cannot be separated from the sealing layer 13. Since the adhesive layer 7 is provided between the battery receiving portion 1 and the printed circuit board 8, as mentioned before, there is no possibility that, on the occasion of forming the sealing layer 13, the sealing resin can enter into the battery receiving portion 1 through a region between the battery receiving portion 1 and the printed circuit board 8.

A backup battery 14 which may be a primary battery or cell such as a lithium battery, for example, or a secondary battery or cell is inserted into the battery receiving portion 1 so as to be electrically connected with a circuitry on the printed circuit board 8, directly or through a lead member (not shown). In FIG. 7, reference numeral 19 denotes a lead or holder serving to maintain contact with the battery 14 in the battery receiving portion.

Figure 6:
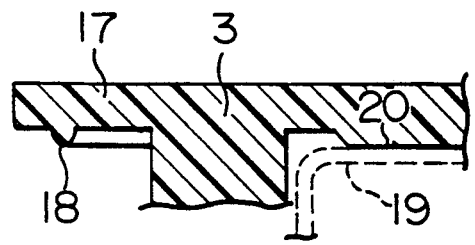
FIG. 6 is an enlarged sectional view of a part of the battery cover.

As shown in FIGS. 5 and 8, an O ring 5 is placed on the stepped portion 6 and an outer peripheral edge portion 17 of the battery cover 3 is placed on the stepped portion 4. The battery cover 3 is also formed of a thermoplastic resin such as a styrene resin, an acetal resin or a polyamide resin. The material of the battery cover 3 is the same as that of the battery receiving portion 1 for facilitating and ensuring the welding. The battery cover 3 is formed with a lower cylindrical end portion 15 and a ring keeping stepped portion 16 so as to be fitted in the battery receiving portion 1 through the O ring 5. Further, as shown in FIG. 6, an annular projection 18 for welding use is formed on the lower surface of the outer peripheral edge portion 17 of the battery cover 3, and a pressure portion 20 is formed on the inner surface of the battery cover 3 for serving to press a lead member 19 against a terminal portion of the battery 14.

Referring to FIG. 8, after the battery 14 is inserted into the battery receiving portion 1, the O ring 5 is put on the ring holding stepped portion 6 and the battery cover 3 is then fitted in the opening of the battery receiving portion 1. Thereafter, the battery cover 3 is fixed at the outer peripheral edge portion 17 thereof to the stepped portion 4 by means of ultrasonic welding, as indicated by reference numeral 21, while it is being kept in the pressed condition against the lead 19. In this way, since the battery cover 3 is fixed with the battery receiving portion 1 while being kept in the pressed condition against the lead 19, a pressing force is constantly exerted in turn on the battery 14 so as to insure the lead member 19 and the battery 14 can be kept in contact with each other.

As the volatile memory 11 described above, a a static RAM, a dynamic RAM, or a combination of them is available.

In the described embodiment, the battery cover 3 is fixed to the battery receiving portion 1 by means of ultrasonic welding. However, the present invention is not limited to this, and the battery cover 3 may be fixed to the battery receiving portion 1 by means of laser beam welding, high-frequency welding or instantaneous adhesives, for example.

Furthermore, the information card can be connected with an external device either in a contact manner or in a non-contact manner.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor card comprising:
    a printed circuit board,
    a plurality of electronic components mounted on said printed circuit board,
    a battery receiving portion fixed to said circuit board formed of a thermoplastic resin for receiving a battery through an opening therein to be electrically connected to said printed circuit board,
    a battery, within said battery receiving portion, electrically connected to said printed circuit board, which serves as a back up to at least one of said electronic components,
    a sealing layer comprising a thermosetting resin within which said printed circuit board and electronic components are integrally embedded, and within which said battery receiving portion is integrally embedded in such a manner that substantially an entire outer surface of said battery receiving portion is held in contact with said sealing layer of thermosetting resin while the opening of said battery receiving portion is left opened to an outside of said sealing layer, and
    a battery cover formed of a thermoplastic resin for closing the opening of said battery receiving portion in which said battery is received, said battery cover being fixed in a liquid tight manner to said battery receiving portion at the opening thereof.

2. A semiconductor card according to claim 1, wherein said battery receiving portion is fixed to said printed circuit board through an adhesive layer.

3. A semiconductor card according to claim 1, wherein said battery receiving portion is annularly shaped, surrounded around an outer periphery thereof by said sealing layer.

4. A semiconductor card as in claim 1, wherein said plurality of electronic components includes a volatile memory element and an interface portion for externally electrically communicating said semiconductor card, and means for electrically connecting said battery within said battery receiving portion to said printed circuit board, said battery serving as backup to said volatile memory element.

5. A semiconductor card according to claim 4, wherein an O-ring is disposed between said battery receiving portion and said battery cover.

6. A semiconductor card according to claim 3, wherein said battery receiving portion is provided with an annular separation-preventive stepped portion on an outer periphery thereof surrounded by said sealing layer.

7. A semiconductor card according to claim 4, further including a lead member electrically connecting said battery to said printed circuit board, such that said battery cover joined to said battery receiving portion applies a constant pressing force against said lead member thereby insuring that said lead member and said battery are kept in continuous contact.

8. A semiconductor card comprising:
    a printed circuit board,
    a volatile memory element mounted on said printed circuit board,
    an interface element mounted in said printed circuit board for electrically communicating said semiconductor card externally,
    a battery receiving portion fixed to said circuit board formed of a thermoplastic resin for receiving a battery through an opening therein to be electrically connected to said printed circuit board to serve as a back up to said volatile memory element, a battery, within said battery receiving portion electrically connected to said printed circuit board, which serves as a back up to said volatile memory element, a sealing layer comprising a thermosetting resin within which said printed circuit board, volatile memory element and interface element are integrally embedded, and in which said battery receiving portion is integrally embedded in such a manner that substantially an entire outer surface of said battery receiving portion is held in contact with said sealing layer of thermosetting resin while the opening of said battery receiving portion if left opened to an outside of said sealing layer, and a battery cover formed of a thermoplastic resin for closing the opening of said battery receiving portion in which said battery is received, said battery cover being fixed in a liquid tight manner to said battery receiving portion at the opening thereof.

* * * * *